(12) United States Patent
Schmid et al.

(10) Patent No.: US 12,116,694 B2
(45) Date of Patent: Oct. 15, 2024

(54) DEVICE AND METHOD FOR PULLING A SINGLE CRYSTAL OF SEMICONDUCTOR MATERIAL

(71) Applicant: Siltronic AG, Munich (DE)

(72) Inventors: Rolf Schmid, Toeging (DE); Helmut Bergmann, Neuoetting (DE); Werner Joedecke, Horgen (CH)

(73) Assignee: SILTRONIC AG, Munich (DE)

( * ) Notice: Subject to any disclaimer, the term of this patent is extended or adjusted under 35 U.S.C. 154(b) by 228 days.

(21) Appl. No.: 17/762,101

(22) PCT Filed: Sep. 15, 2020

(86) PCT No.: PCT/EP2020/075732
§ 371 (c)(1),
(2) Date: Mar. 21, 2022

(87) PCT Pub. No.: WO2021/069179
PCT Pub. Date: Apr. 15, 2021

(65) Prior Publication Data
US 2022/0349086 A1    Nov. 3, 2022

(30) Foreign Application Priority Data
Oct. 10, 2019    (DE) ............... 10 2019 215 575.8

(51) Int. Cl.
*C30B 15/30* (2006.01)
*C30B 15/10* (2006.01)
*C30B 29/06* (2006.01)

(52) U.S. Cl.
CPC .............. *C30B 15/30* (2013.01); *C30B 15/10* (2013.01); *C30B 29/06* (2013.01)

(58) Field of Classification Search
CPC ......... C30B 15/30; C30B 29/06; C30B 15/28; Y10T 117/1072
See application file for complete search history.

(56) References Cited

U.S. PATENT DOCUMENTS

| | | | | |
|---|---|---|---|---|
| 4,663,128 | A * | 5/1987 | Helgeland | C30B 15/30 254/293 |
| 5,156,822 | A * | 10/1992 | Whipple, III | G01H 1/003 117/911 |
| 5,863,326 | A * | 1/1999 | Nause | C30B 15/14 117/49 |
| 6,858,076 | B1 * | 2/2005 | Nakajima | C30B 29/06 117/14 |
| 8,257,496 | B1 * | 9/2012 | Bender | C30B 29/06 117/214 |

(Continued)

FOREIGN PATENT DOCUMENTS

| CN | 2199028 Y | 5/1995 |
|---|---|---|
| CN | 201241197 Y | 5/2009 |

(Continued)

*Primary Examiner* — Robert M Kunemund
(74) *Attorney, Agent, or Firm* — LEYDIG, VOIT & MAYER, LTD.

(57) ABSTRACT

An apparatus is configured to pull a single crystal of semiconductor material from a melt contained in a crucible. The apparatus includes: a rotatable pulling shaft; a rotatable crucible shaft; a double worm gear between a drive and the pulling shaft; and a further double worm gear between a further drive and the crucible shaft.

6 Claims, 2 Drawing Sheets

(56) References Cited

U.S. PATENT DOCUMENTS

| | | | |
|---|---|---|---|
| 8,496,765 B2* | 7/2013 | Orschel | C30B 15/20 149/11 |
| 2012/0089254 A1* | 4/2012 | Shafer | B25J 17/00 901/46 |
| 2013/0235454 A1 | 9/2013 | Hopf et al. | |
| 2014/0345528 A1* | 11/2014 | Yang | H01L 21/67126 118/723 R |

FOREIGN PATENT DOCUMENTS

| CN | 104044510 A | 9/2014 |
|---|---|---|
| CN | 104141738 A | 11/2014 |
| CN | 205115669 U | 3/2016 |
| CN | 107664174 A | 2/2018 |
| EP | 0466457 A1 | 1/1992 |
| JP | 2017176675 A | 10/2017 |
| RU | 2051208 C1 | 12/1995 |

* cited by examiner

DEVICE AND METHOD FOR PULLING A SINGLE CRYSTAL OF SEMICONDUCTOR MATERIAL

CROSS REFERENCE TO RELATED APPLICATIONS

This application is a U.S. National Phase application under 35 U.S.C. § 371 of International Application No. PCT/EP2020/075732, filed on Sep. 15, 2020, and claims benefit to German Patent Application No. DE 10 2019 215 575.8, filed on Oct. 10, 2019. The International Application was published in German on Apr. 15, 2021 as WO 2021/069179 A1 under PCT Article 21(2).

FIELD

The invention provides an apparatus for pulling a single crystal of semiconductor material from a melt contained in a crucible, and also a method for pulling a single crystal of semiconductor material wherein the apparatus is used.

BACKGROUND

Single crystals of semiconductor material are frequently produced by the Czochralski (CZ) method, wherein a single crystal growing on a seed crystal is pulled upwardly away from a melt, which is contained in a crucible. On the industrial scale, single crystals of semiconductor material such as silicon, in particular, are produced in this way, before being subsequently processed further into semiconductor wafers and later on into electronic components.

An apparatus for employing the CZ method generally comprises a crucible, which is held by a raiseable and lowerable crucible shaft, and a raiseable and lowerable pulling shaft, which is used to pull the growing single crystal away from the melt. The constituents of such an apparatus further include one device each for rotating the pulling shaft and for rotating the crucible shaft. Single-crystalline growth requires an ultra low-jitter environment, and this is the reason why particular importance attaches to the devices for performing the rotational movements of the pulling shaft and of the crucible shaft.

An apparatus is shown in EP 0 466 457 A1 wherein the device for rotating the pulling shaft comprises a motor which drives a gearwheel, this gearwheel engaging into a worm wheel which is mounted on the pulling shaft. The device for rotating the crucible shaft comprises a motor which drives the crucible shaft directly.

An apparatus of this kind no longer satisfies the present-day demands for the provision of an ultra low-jitter environment. In particular there is no assurance that comparatively longwave vibrations are adequately suppressed.

SUMMARY

In an embodiment, the present disclosure provides an apparatus that is configured to pull a single crystal of semiconductor material from a melt contained in a crucible. The apparatus includes: a rotatable pulling shaft; a rotatable crucible shaft; a double worm gear between a drive and the pulling shaft; and a further double worm gear between a further drive and the crucible shaft.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
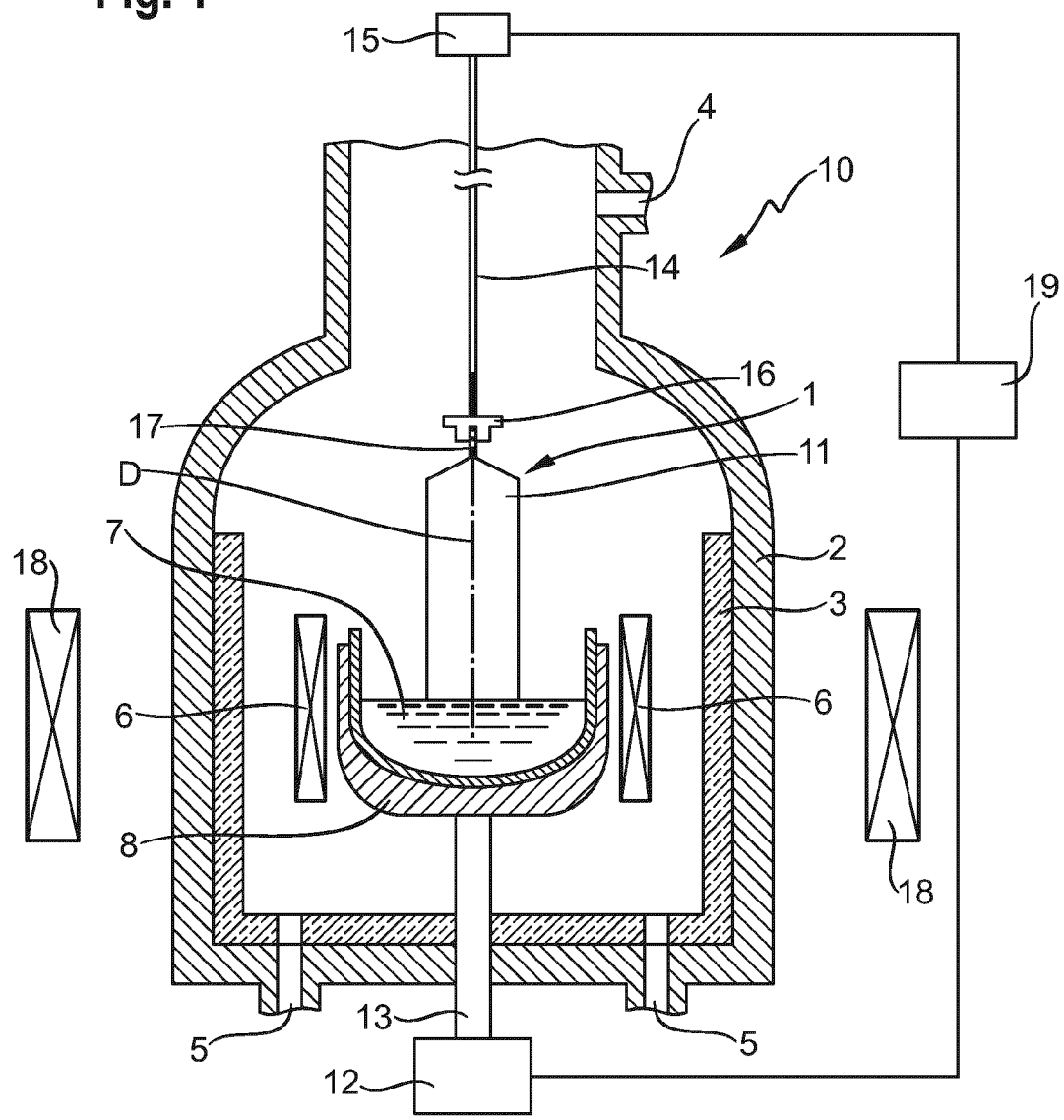
FIG. 1 shows an apparatus for pulling a single crystal by the CZ method that can be utilized for implementing an embodiment of the invention.

In an embodiment, the present invention provides an apparatus and a method for pulling single crystals of semiconductor material, where the devices of the apparatus for rotating the pulling shaft and the crucible shaft are designed in such a way as to provide assurance of low-jitter operation of these devices.

An embodiment of the invention provides an apparatus for pulling a single crystal of semiconductor material from a melt contained in a crucible, having a device for rotating a pulling shaft and having a device for rotating a crucible shaft, characterized by a double worm gear between a drive and the pulling shaft and by a further double worm gear between a further drive and the crucible shaft.

The apparatus, according to one or more embodiments of the present invention, not only achieves the low-jitter operation, but also represents a space-saving and maintenance-friendly solution for bringing about the rotation of the pulling shaft and of the crucible shaft. The two double worm gears are notable for comparatively low play and for comparatively pronounced smooth running. Longwave vibrations, which may be brought about in particular by low rotary speeds of the crucible shaft, of less than 1 rpm, and/or following a change in the rotational direction of the crucible shaft, are effectively suppressed.

The inventors have found out that, according to a particularly preferred embodiment, it is necessary to install one double worm gear in each case between the pulling shaft and the drive that places it in rotation and between the crucible shaft and the further drive that places it in rotation, respectively. With an arrangement of this kind, the respective drive, preferably an electric motor, whose shaft drives the first worm of the respective double worm gear has a position lateral to the axis of rotation of the pulling shaft (or lateral to the axis of rotation of the crucible shaft, respectively) with a sufficient distance from the respective axis of rotation. The respective drive is preferably mounted rigidly on a housing plate of the respective double worm gear. There is therefore no spring mounting of the respective drive. The shaft of the respective drive is preferably arranged parallel to the pulling shaft (or crucible shaft, respectively). The first worm of the respective double worm gear engages into a respective first worm wheel, which is mounted coaxially on the shaft of the second worm of the respective double worm gear. The second worm of the respective double worm gear engages in turn into the respective second worm wheel of the respective double worm gear, with the respective second worm wheel being mounted coaxially on the pulling shaft (or crucible shaft, respectively).

It is preferred, furthermore, for the pulling shaft and the crucible shaft to be divided, respectively, into an upper portion and a lower portion and for the two portions to be connected in each case via a coupling bellows. Furthermore, at least in the case of the pulling shaft, the coupling bellows are configured in such a way that they provide the upper portion of the pulling shaft with electrical isolation from the lower portion of the pulling shaft. This enables simple implementation of the detection of the surface of the melt via a current circuit which comprises the lower portion of the crucible shaft.

The drive of the crucible shaft is preferably designed in such a way that the direction of rotation of the crucible shaft can also be reversed.

FIG. 1 shows, as an example embodiment, an apparatus 10 for pulling a single crystal 1 of semiconductor material from a melt 7, which can be utilized in the invention. The apparatus comprises a chamber 2, a heater 6, a crucible 8, a crucible shaft 13, a pulling shaft 14, and a magnetic field generation coil 18. One internal wall of the chamber 2 is provided with a heat insulation material 3. In the upper part of the chamber 2 there is a gas inlet 4, through which an inert gas such as argon is introduced, and at the lower part of the chamber 2 there is a gas outlet 5. The crucible 8 supports an internal crucible which is filled with the melt 7 of semiconductor material. Around the crucible 8 is the heater 6, to melt solid semiconductor material and maintain it in the melted state. The crucible shaft 13 extends from a lower end of the crucible 8 to the base of the chamber, and is mounted by a supporting device 12. The crucible shaft 13 can be raised and lowered and rotated by the supporting device 12. The pulling shaft 14 is held at the upper end by a holding device 15 and, with the aid of the holding device 15, can be raised and lowered and rotated around an axis of rotation D. The supporting device 12 and the holding device 15 are controlled by a controller 19. By passing a current through the magnetic field generation coil 18 a magnetic field, for example a horizontal magnetic field, can be imposed on the melt 7. Furthermore, a heat shield can also be arranged around the growing single crystal 11. The reference numerals 16 and 17 denote a seed crystal holder and a seed crystal.

Figure 2:
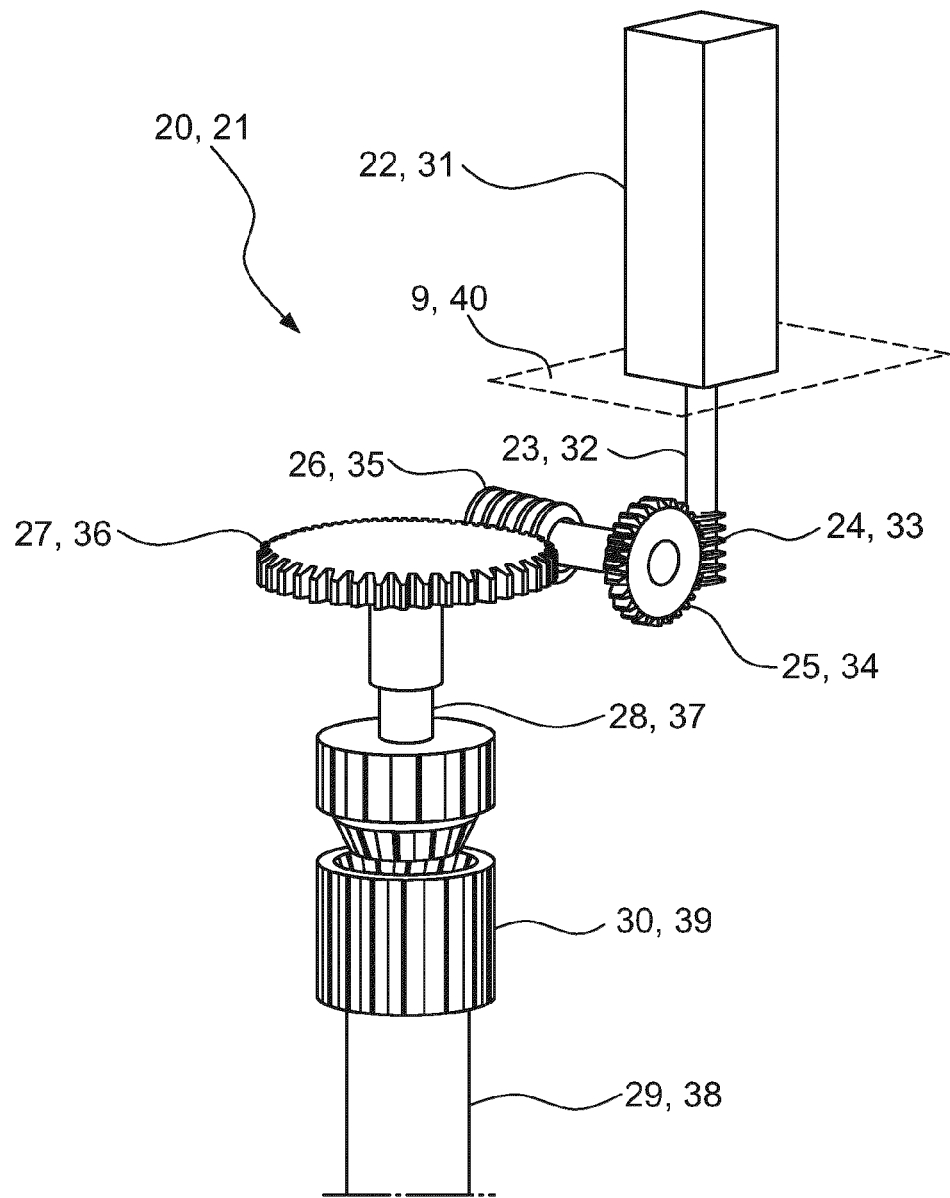
FIG. 2 shows features of an apparatus according to an exemplary embodiment of the invention.

In accordance with the illustration in FIG. 2, the holding device 15 comprises a device 20 for rotating the pulling shaft 14, and the supporting device 12 comprises a device 21 for rotating the crucible shaft 13. The devices 20 and 21 are designed in accordance with an embodiment of the invention.

The device 20 for rotating the pulling shaft 14 comprises a drive 22 having a driveshaft 23 which drives a first worm 24. The first worm 24 engages into a first worm wheel 25, which is fixed coaxially on a shaft of a second worm 26. The second worm 26 engages into a second worm wheel 27, which is fixed coaxially on an upper portion 28 of the pulling shaft 14. The first and second worms 24, 26 and the first and second worm wheels 25, 27 together form a double worm gear. The drive 22 is mounted rigidly on a housing plate 9 of the double worm gear. Between the upper portion 28 of the pulling shaft 14 and a lower portion 29 of the pulling shaft 14 there is a first bellows coupling 30 arranged, which performs electrical isolation of the upper portion 28 of the pulling shaft 14 from the lower portion 29 of the pulling shaft 14.

The device 21 for rotating the crucible shaft 13 comprises a further drive 31 having a further driveshaft 32 which drives a further first worm 33. The further first worm 33 engages into a further first worm wheel 34, which is fixed coaxially on a shaft of a further second worm 35. The further second worm 35 engages into a further second worm wheel 36, which is fixed coaxially on a lower portion 37 of the crucible shaft 13. The further first and second worms 33, 35 and the further first and second worm wheels 34, 36 together form a further double worm gear. The further drive 31 is mounted rigidly on a further housing plate 40 of the further double worm gear. Arranged between the lower portion 37 of the crucible shaft 13 and an upper portion 38 of the crucible shaft 13 is a further bellows coupling 39.

The description above of illustrative embodiments should be understood as a description of examples. The disclosure made accordingly on the one hand enables the skilled person to understand the present invention and the advantages associated with it, while on the other hand the understanding of the skilled person also encompasses obvious alterations and modifications of the methods and structures described. The intention is therefore that all such alterations and modifications, and also equivalents, are covered by the scope of protection of the claims.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SYMBOLS USED 1 single crystal
2 chamber
3 heat insulation material
4 gas inlet
5 gas outlet
6 heater
7 melt
8 crucible
9 housing plate
10 apparatus for pulling
11 growing single crystal
12 supporting device
13 crucible shaft
14 pulling shaft
15 mounting device
16 seed crystal holder
17 seed crystal
18 magnetic field generation coil
19 controller
20 device for rotating the pulling shaft 21 device for rotating the crucible shaft
22 drive
23 driveshaft
24 first worm
25 first worm wheel
26 second worm
27 second worm wheel
28 upper portion of the pulling shaft
29 lower portion of the pulling shaft
30 bellows coupling
31 further drive
32 further driveshaft
33 further first worm
34 further first worm wheel
35 further second worm
36 further second worm wheel
37 lower portion of the crucible shaft
38 upper portion of the crucible shaft
39 further bellows coupling
40 further housing plate
D axis of rotation

The invention claimed is:

1. An apparatus for pulling a single crystal of semiconductor material from a melt contained in a crucible, the apparatus comprising:
   a rotatable pulling shaft;
   a rotatable crucible shaft;
   a double worm gear between a drive and the pulling shaft; and
   a further double worm gear between a further drive and the crucible shaft,
   wherein the double worm gear comprises: a first worm; a second worm; a first worm wheel; and a second worm wheel,
   wherein the further double worm gear comprises: a further first worm; a further second worm; a further first worm wheel; and a further second worm wheel,
   wherein the drive comprises a driveshaft that is arranged parallel to the pulling shaft,
   wherein the further drive comprises a further driveshaft that is arranged parallel to the crucible shaft,
   wherein, for the double worm gear:
      the first worm engages into the first worm wheel;
      the first worm wheel is mounted coaxially on a shaft of the second worm;
      the second worm engages into the second worm wheel; and
      the second worm wheel is mounted coaxially on the pulling shaft, and wherein, for the further double worm gear:
      the further first worm engages into the further first worm wheel;
      the further first worm wheel is mounted coaxially on a shaft of the further second worm;
      the further second worm engages into the further second worm wheel; and
      the further second worm wheel is mounted coaxially on the crucible shaft.

2. The apparatus according to claim 1, the apparatus further comprising a bellows coupling between an upper portion and a lower portion of the pulling shaft.

3. The apparatus according to claim 1, the apparatus further comprising a bellows coupling between an upper portion and a lower portion of the crucible shaft.

4. The apparatus according to claim 1, wherein the drive is mounted rigidly on a housing plate of the double worm gear.

5. The apparatus according to claim 1, wherein the further drive is mounted rigidly on a further housing plate of the further double worm gear.

6. A method for pulling the single crystal of semiconductor material from the melt by the Czochralski (CZ) method, the method comprising pulling the single crystal of semiconductor material using the apparatus according to claim 1.

* * * * *